(12) United States Patent
Bohnhoff et al.

(10) Patent No.: US 7,017,103 B2
(45) Date of Patent: Mar. 21, 2006

(54) DEVICE AND METHOD FOR VITERBI EQUALIZATION WITH METRIC INCREMENTS CALCULATED IN ADVANCE

(75) Inventors: Peter Bohnhoff, München (DE); Burkhard Becker, Ismaning (DE); Bin Yang, Stuttgart (DE)

(73) Assignee: Infineon Technologies AG, Munich (DE)

( * ) Notice: Subject to any disclaimer, the term of this patent is extended or adjusted under 35 U.S.C. 154(b) by 251 days.

(21) Appl. No.: 10/336,556

(22) Filed: Jan. 3, 2003

(65) Prior Publication Data

US 2003/0118093 A1    Jun. 26, 2003

Related U.S. Application Data

(63) Continuation of application No. PCT/DE01/02201, filed on Jun. 11, 2001.

(30) Foreign Application Priority Data

Jul. 3, 2000    (DE)    ............................. 100 32 237

(51) Int. Cl.
    *H03M 13/03*    (2006.01)
(52) U.S. Cl. ................. 714/795; 714/794; 714/796
(58) Field of Classification Search ............... 714/795, 714/786, 794, 796; 375/355, 341
    See application file for complete search history.

(56) References Cited

U.S. PATENT DOCUMENTS

| 5,181,209 A | * | 1/1993 | Hagenauer et al. | ......... 714/795 |
| 5,185,747 A | * | 2/1993 | Farahati | ....................... 714/795 |
| 5,335,250 A | * | 8/1994 | Dent et al. | .................. 375/224 |
| 6,314,148 B1 | * | 11/2001 | Fulghum | .................... 375/355 |
| 6,347,125 B1 | * | 2/2002 | Dent | .......................... 375/341 |
| 6,445,754 B1 | * | 9/2002 | Itoi | ............................. 375/341 |

FOREIGN PATENT DOCUMENTS

| DE | 195 11 015 A1 | 9/1996 |
| EP | 0 632 623 A2 | 1/1995 |

OTHER PUBLICATIONS

Raphaeli, D. et al.: "A Reduced Complexity Algorithm for Combined Equalization and Decoding for Channels with Multipath, ISI or Partial Response", IEEE, Nov. 14, 1995, pp. 83-87.
Erfanian, J. A. et al.: "Reduced Complexity Symbol Detectors with Parallel Structures", IEEE, 1990, pp. 704-708.
Jung, P: "Entwurf und Realisierung von Viterbi-Detektoren für Mobilfunkkanäle" [Layout and Realization of Viterbi-Detectors for Mobile Radio Channels], VDI Verlag, Ed. 10, No. 238, pp. 90-111.
Forney, G. D.: "The Viterbi Algorithm", IEEE, vol. 61, No. 3, Mar. 1973, pp. 268-278.

* cited by examiner

*Primary Examiner*—Albert Decady
*Assistant Examiner*—Dipakkumar Gandhi
(74) *Attorney, Agent, or Firm*—Laurence A. Greenberg; Werner H. Stemer; Ralph E. Locher

(57) ABSTRACT

A Viterbi equalizer for equalization of a data signal transmitted via a channel that is subject to interference has at least one add-compare-select unit (ACS), which carries out an ACS operation for each channel state in a time step k. Furthermore, the equalizer has a unit for calculating metric increments in advance and for storing the metric increments. The calculation unit calculates in advance the metric increments relating to all the transitions from a state which can be predetermined in the time step k to the states which can be reached by the transitions in the time step k+1. The metric increments are retained in an output memory such that they can be called up for utilization in the ACS unit.

16 Claims, 5 Drawing Sheets

DEVICE AND METHOD FOR VITERBI EQUALIZATION WITH METRIC INCREMENTS CALCULATED IN ADVANCE

CROSS-REFERENCE TO RELATED APPLICATION

This is a continuation of copending International Application No. PCT/DE01/02201, filed Jun. 11, 2001, which designated the United States and which was not published in English.

BACKGROUND OF THE INVENTION

Field of the Invention

The invention relates to a Viterbi equalizer for equalization of a data signal transmitted via a channel that is subject to interference. The Viterbi equalizer has at least one ACS unit (ACS, add-compare-select), which, with reference to each channel state relating to the time step k carries out an ACS operation to determine that state transition which, with minimal metrics, leads from one of the possible predecessor states relating to the time step k−1 to the destination state under consideration relating to the time step k. The method utilizes the Viterbi algorithm for equalizing the data signal which is transmitted via a channel that is subject to interference.

Viterbi equalizers are already known and are currently used widely as adaptive equalizers in the mobile radio field.

Viterbi equalizers are maximum likelihood sequence estimators (MLSE). During the sequence estimation process, a sequence $\{a_k\}$ that is actually transmitted by the transmitter and comprises L+1 data symbols $a_k$, k=0, ..., L is estimated on the basis of a detected received sequence $\{x_k\}$ comprising L+1 data symbols $x_k$, k=0, ..., L. The latter will also be referred to in the following text as sample values. The data sequence which is estimated at the receiver end is referred to as $\{A_k\}$ in the following text. The latter likewise comprises L+1 data symbols $A_k$, k=0, ..., L which, in a perfect situation, match the transmitted data symbols $a_k$.

The principle of maximum likelihood sequence estimation (MLSE) is simple: if the transmission characteristics of the transmission channel are described by v+1 channel impulse responses $h_0, h_1, \ldots, h_v$ (v is an integer greater than or equal to 0), then the sample values $x_k$ can be expressed in accordance with $$\sum_{l=0}^{v} a_{k-l} h_l + n_k$$

as time-discrete convolutions of the transmitted data sequence $\{a_k\}$ with the channel impulse responses $h_0, h_1, \ldots, h_v$ plus an additive disturbance (described by a sequence $\{n_k\}$ comprising L+1 disturbance values $n_k$, k=0, ..., L).

In the receiver, the sample values $x_k$ are known as "measured values" and the channel impulse responses $h_0, h_1, \ldots, h_v$ of the channel are estimated at regular time intervals. The estimated channel impulse responses are referred to as $H_0, H_1, \ldots, H_v$ in the following text. That L+1-element data sequence $\{A_k\}$ of all the possible L+1-element data sequences whose data symbols, weighted with the estimated channel impulse responses $H_0, H_1, \ldots, H_v$, are at the shortest Euclidean distance from the data sequence of the measured sample values $x_k$ is determined as the supposedly transmitted sequence. This means that the condition for the data sequence $\{A_k\}$ being sought is:

$$\sum_{k=0}^{L+v} \left( x_k - \sum_{l=0}^{v} A_{k-l} H_l \right)^2 = \text{minimum} \quad (1)$$

The difficulty is to solve this minimization task with little effort and little expense.

One recursive solution, which is based on A. J. Viterbi and G. D. Forney, for equation (1) is known as the Viterbi algorithm. The major advantage of the Viterbi recursion method is that the majority of the data sequences which are in principle possible can be eliminated in each recursion step so that, in the end, only a fraction of all the possible data sequences need be followed as far as the end of the transmission (that is to say the reception of all the sample values $x_k$, k=0, ..., L).

In the book *Entwurf und Realisierung von Viterbi-Detektoren für Mobilfunkkanäle* [Design and implementation of Viterbi detectors for mobile radio channels], by P. Jung, VDI Research Reports, Series 10, No. 238, VDI-Verlag, which represents the closest prior art, Sections 5.2.3 and 5.2.4 (pages 91 to 111) describe a large number of equalizers whose method of operation is based on the Viterbi algorithm.

The known Viterbi equalization method is also used for the purposes of the invention, and will be described briefly in this context.

The Viterbi equalization method is based on the fact that the time-discrete v+1 path channel can be modeled by a clocked, finite automaton, as shown in FIG. 1. The automaton comprises a shift register SR consisting of v memory cells T. Taps (a total quantity of v+1) are in each case located before and after each memory cell T, and lead to multipliers M which multiply the values of the data symbols by a respective one of the currently estimated channel impulse responses $H_0, H_1, \ldots, H_v$. The output step of the automaton is in the form of an adder ADD which adds the outputs from the v+1 multipliers.

In this model, the memory contents of the shift register describe the state of the channel. The memory contents of the first memory cell on the input side in the time step k are referred to as $z_k^1$, and the memory contents of the subsequent memory cells are referred to as $z_k^2, z_k^3, \ldots, z_k^v$. The state $Z_k$ of the channel in the time step k is then defined uniquely by the details of the memory contents, that is to say by the v-tuple $Z_k = (z_k^v, \ldots, z_k^2, z_k^1)$.

In the k-th time step, the shift register has just been supplied with the data symbol $a_k$ on the input side. At this moment, the memory cells in the shift register thus store the previously entered data symbols $(a_{k-v}, \ldots, a_{k-2}, a_{k-1})$. In general, the memory contents of each memory cell change with each time step, since the stored data symbol is shifted to the next memory cell.

The sequence $\{Z_k\}$ of states which results in this case defines a path through a regular graph which is plotted against the discrete time kT (T denotes the symbol time duration). This graph is called a trellis diagram. The Viterbi algorithm determines the sequence $\{Z_k\}$ of states through the trellis diagram in order to estimate the transmitted sequence $\{a_k\}$. The path through the trellis diagram defined by the sequence $\{Z_k\}$ is also referred to as the "shortest" path through the trellis diagram.

Using the example of an M-step data signal (M=8 was chosen for this description), FIG. 2 shows a detail of the trellis diagram from the two time steps k−1 and k. There are $N=M^v$ channel states in each time step in an M-step data signal. The N channel states relating to the time step k are annotated $Z_k^1, Z_k^2, \ldots, Z_k^N$, and a corresponding notation is used for the N channel states relating to the time step k−1. Each state relating to the time step k can be reached by M transitions starting from M different predecessor states relating to the time step k−1. Those M possible predecessor states relating to the time step k−1 are now considered which lead to a specific state $Z_k^q$, which is identified by the index q, relating to the time step k. In the previous recursion, the shortest path which leads to this state was determined for each of these M possible predecessor states $$Z_{k-1}^{i1}, Z_{k-1}^{i2}, \ldots, Z_{k-1}^{iM}$$

relating to the time step k−1, and these are illustrated by shaded lines in FIG. 2. The question is which of these M paths which lead to the possible predecessor states $$Z_{k-1}^{i1}, Z_{k-1}^{i2}, \ldots, Z_{k-1}^{iM}$$

is that which, if it is continued to the specific state $Z_k^q$ in the time step k, creates the shortest path to this state.

In order to answer this question, the Viterbi algorithm calculates a metric increment $$I(Z_{k-1}^{i1}, x_{k-1}), I(Z_{k-1}^{i2}, x_{k-1}), \ldots, I(Z_{k-1}^{iM}, x_{k-1})$$

for each of the transitions under consideration (between one of the possible predecessor states $$Z_{k-1}^{i1}, Z_{k-1}^{i2}, \ldots, Z_{k-1}^{iM}),$$

to be precise using $$I(Z_{k-1}^i, x_{k-1}) = \left(x_{k-1} - \sum_{l=1}^{v} z_{k-1}^{l,(i)} H_l - z_k^{1,(q)} H_0\right)^2 \quad (2)$$

i=i1, i2, . . . , iM, where, in accordance with the already introduced notation, the M predecessor states $$Z_{k-1}^i = (Z_{k-1}^{v,(i)}, \ldots, Z_{k-1}^{2,(i)}, Z_{k-1}^{1,(i)})$$

are described by the respective occupancy of the v memory cells in the shift register SR, and $$Z_k^{1,(q)}$$

denotes the transition symbol between the states $$Z_{k-1}^i$$

and $Z_k^q$.

A minimum metric $$Me(Z_{k-1}^{i1}), Me(Z_{k-1}^{i2}), \ldots, Me(Z_{k-1}^{iM})$$

has already been calculated on the basis of the recursive method of calculation with respect to the time step k for each of the M possible predecessor states $$Z_{k-1}^{i1}, Z_{k-1}^{i2}, \ldots, Z_{k-1}^{iM}.$$

The path decision process for the time step k is carried out on the basis of these known M minimum metrics $$Me(Z_{k-1}^{i1}), Me(Z_{k-1}^{i2}), \ldots, Me(Z_{k-1}^{iM})$$

for the possible predecessor states and the calculated M metric increments $$I(Z_{k-1}^i, x_{k-1}).$$

This comprises three steps:

An addition step ("ADD") calculates the M candidates which are annotated $me^i(Z_k^q)$ for the minimum metric of the specific state $Z_k^q$ as the respective sum of the minimum metric of one of the predecessor states and of the associated metric increment using:

$$me^i(Z_k^q) = Me(Z_{k-1}^i) + I(Z_{k-1}^i Z, x_{k-1}), i = i1, i2, \ldots, iM \quad (3)$$

A comparison step ("COMPARE") determines that one of the M calculated metrics $me^i(Z_k^q)$ which has the smallest value. This is the minimum metric $Me(Z_k^q)$ of the specific state.

A selection step ("SELECT") selects that predecessor state of the M possible predecessor states $$Z_{k-1}^{i1}, Z_{k-1}^{i2}, \ldots, Z_{k-1}^{iM}$$

which is the point of origin for the transition to the state $Z_k^q$ with the minimum metric $Me(Z_k^q)$, that is to say the index i is determined for which $me^i(Z_k^q) = Me(Z_k^q)$. The "correct" predecessor state is thus determined. Those paths which lead to the other predecessor states now need not be followed any further.

These three steps are fundamental to Viterbi equalization and are known in the literature as ACS (Add-Compare-Select) operations.

It is clear that each ACS operation must necessarily be carried out "backwards" in time (from k to k−1) since it is linked to a specific destination state with respect to the time step k, but transitions starting from the time step k−1 to this specific destination state are assessed.

The implementation complexity of a Viterbi equalizer increases drastically for data signals having a large number of steps. While GSM (Global System for Mobile Communications) uses a binary (that is to say two-step) data signal, the new EDGE (Enhanced Data Services for GSM Evolution) Standard is based on the 8-PSK (Phase Shift Keying) modulation method, which presupposes an 8-step data signal (M=8). This means that 8 state transitions start from each trellis state, and 8 state transitions end in each trellis state. A channel with a channel memory of, for example, v=5 would lead to $N=8^5$ possible channel states for which an ACS operation would have to be carried out for each time step. In this case, the 8 possible predecessor states would have to be determined and the 8 metric increments calculated for each ACS operation for one destination state. The implementation or computation complexity required to do this is too high for practical applications.

It has therefore already been proposed that only some of the $M^v$ channel states, rather than all of them, should be considered in the Viterbi equalization for data signals having a large number of steps.

SUMMARY OF THE INVENTION

It is accordingly an object of the invention to provide a Viterbi equalizer and an equalization method which overcome the above-mentioned disadvantages of the heretofore-known devices and methods of this general type and which provides for a Viterbi equalizer that is particularly suitable for equalization of data signals having a large number of steps, in particular for data signals in accordance with the EDGE Standard, and which provides for a method that is particularly suitable for the equalization of such data signals having a large number of steps.

With the foregoing and other objects in view there is provided, in accordance with the invention, a Viterbi equalizer for equalization of a data signal transmitted via a channel that is subject to interference, comprising:

at least one add-compare-select unit (ACS) operable to carry out, with reference to each channel state relating to a time step k, an add-compare-select (ACS) operation for determining a given state transition leading, with minimal metrics, from one possible predecessor state relating to a time step k−1 to a destination state relating to the time step k;

a calculation unit for calculating metric increments in advance and an output memory for storing the metric increments calculated by the calculation unit;

the calculation unit being operable to:

calculate the metric increments for all transitions starting from a given state relating to the time step k to the states in a time step k+1 that can in each case be achieved by the transitions; and store the metric increments in the output memory for call-up by the add-compare-select unit for carrying out the add-compare-select operations with respect to the destination states in the time step k+1.

In other words, according to the invention, the metric increments for the transitions from the time step k to the time step k+1 are calculated linked to an initial state relating to the time step k to the states which can be reached by transitions relating to the time step k+1, that is to say in the "forwards direction". By calculating the metric increments in advance and by storing them, the complexity required for memory accesses for Viterbi equalization can be reduced. Clearly, the major advantage which results from simple calculation of metric increments "in the forwards direction" outweighs the disadvantage that the previously calculated metric increments (which may also already have been sorted on the basis of the destination states being considered) must be read from the output memory on the basis of the destination states under consideration in the subsequent ACS operations (relating to the time step k+1).

In the following text, the expression channel state or state always refers to the states (of which there are N) which are actually taken into account in the ACS operation. As already mentioned, N may in this case be considerably less than $M^v$. In particular, only N=M states may be considered.

The respective metric increments are preferably calculated in advance not only for some states, but for all the states relating to the time step k. In consequence, both the metrics of all the states as well as all the metric increments for the transitions from the time step k to the time step k+1 can still be called up at this time for the time step k.

One preferred configuration of the unit for calculating metric increments in advance and for storing them is characterized in that this unit comprises a first calculation unit for calculating the partial amounts, in particular partial sums, of metric increments, and a second calculation unit for addition in each case of those partial amounts which form the metric increments to be calculated in advance. This two-part configuration is advantageous since it allows the calculation of the metric partial amounts to be carried out separately from the addition of the respective partial amounts; this is in turn advantageous since the calculation of the metric partial amounts is carried out at longer time intervals (namely on each update of the estimated channel impulse responses) than the addition of the partial amounts (which must be carried out for each calculation of a metric increment).

One advantageous embodiment of the first calculation unit is characterized in that one, two or three channel impulse responses is or are included in the calculation of a partial amount. A metric increment is then preferably formed by the sum of six, three or two partial amounts in the second calculation unit.

The output memory of the unit for calculating metric increments in advance and for storing them preferably has a partial amount memory element which can be used to store not only the calculated metric increments but also the calculated partial amounts. In this case, it is expedient for the partial amount memory unit to be designed to store two complete sets of partial amounts. This ensures that the second calculation unit is operated without any interruption, since the partial amounts which are stored in the one memory section can be updated at the same time that accesses are made to the other memory section.

The Viterbi equalizer according to the invention and the method according to the invention can be used advantageously especially in the situation where M=8, that is to say for example with the EDGE Standard.

With the above and other objects in view there is also provided, in accordance with the invention, a method for equalizing a data signal transmitted via a channel that is subject to interference, wherein the data signal is equalized with the Viterbi algorithm, and the method comprises the following steps:

calculating, for all transitions between a given state of a time step k and states of a time step k+1 that can be reached from the given state, associated metric increments, and storing the metric increments in an output memory;

calling up the metric increments from the output memory; and determining, with an add-compare-select operation utilizing the metric increments called up from the output memory, a transition leading with minimum metrics from one possible predecessor state relating to the time step k to a specific destination state relating to the time step k+1.

One particularly preferred refinement of the method according to the invention is characterized in that as soon as an ACS operation relating to a specific destination state relating to the $k^{th}$ time step has been carried out, taking account of the transition which is in this case found to this state, all the metric increments are calculated starting from the specific state to all the states relating to the $k+1^{th}$ time step, to be precise they are carried out even during ACS operations relating to further destination states relating to the time step k. This means that the calculation of the metric increments (for the transition from k to k+1) and the process of carrying out the ACS operations (for the transition from k−1 to k) is constrained, and takes place essentially at the same time.

Other features which are considered as characteristic for the invention are set forth in the appended claims.

Although the invention is illustrated and described herein as embodied in a viterbi equalization by means of metric increments calculated in advance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The following description of a Viterbi equalizer according to the invention and of a Viterbi equalization method according to the invention is based, for the purposes of an example, on the EDGE Standard with M=8 and on an 8-PSK modulation method. It will be understood by those of skill in the art, however, that the invention is in no way restricted to equalizers or equalization methods for data signals based on the EDGE Standard, that is to say the invention may also be used, inter alia, for data signals where M≠8 and/or for modulation other than PSK.

Figure 1:
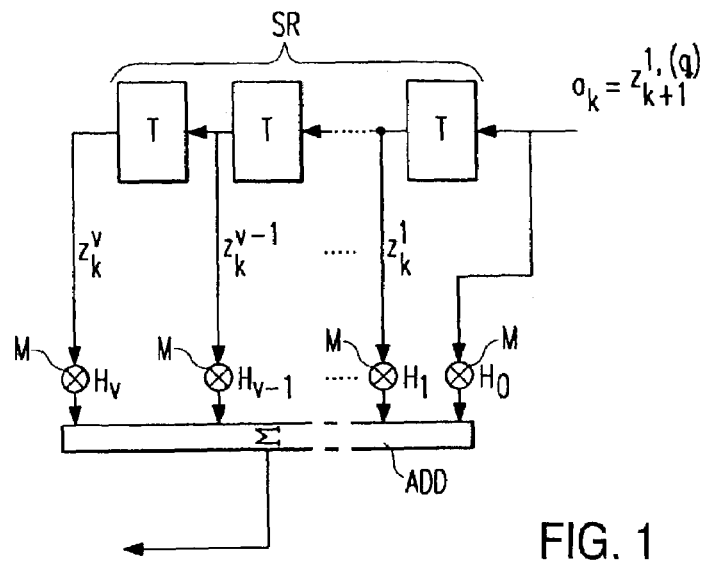
FIG. 1 is an equivalent block circuit of a model of a mobile radio channel.

A channel memory length of v=5 is assumed in the following example. However, instead of $8^5$ states, only eight states of the channel are considered. The individual 8-PSK data symbols are annotated PSK0, PSK1, PSK2, . . . , PSK7. Each state of the channel can in consequence be identified by the data symbol (which corresponds to $z_k^1$ in FIG. 1) which is stored in the first memory cell T on the input side and, furthermore, contains the information about the last four predecessor states. A channel state can accordingly be defined by a 5-component state vector:

PSKi+3,PSKi+2,PSKi+1,PSKi,PSKp

In this case, in order to simplify the notation, the index k for indicating the time step is omitted. The underscoring indicates the most recently received data symbol PSKp, which determines the state, and the four previously received data symbols, which are not underlined, can be regarded as additional information relating to this state, which is relevant only in the calculation of the metric increments.

Figure 3:
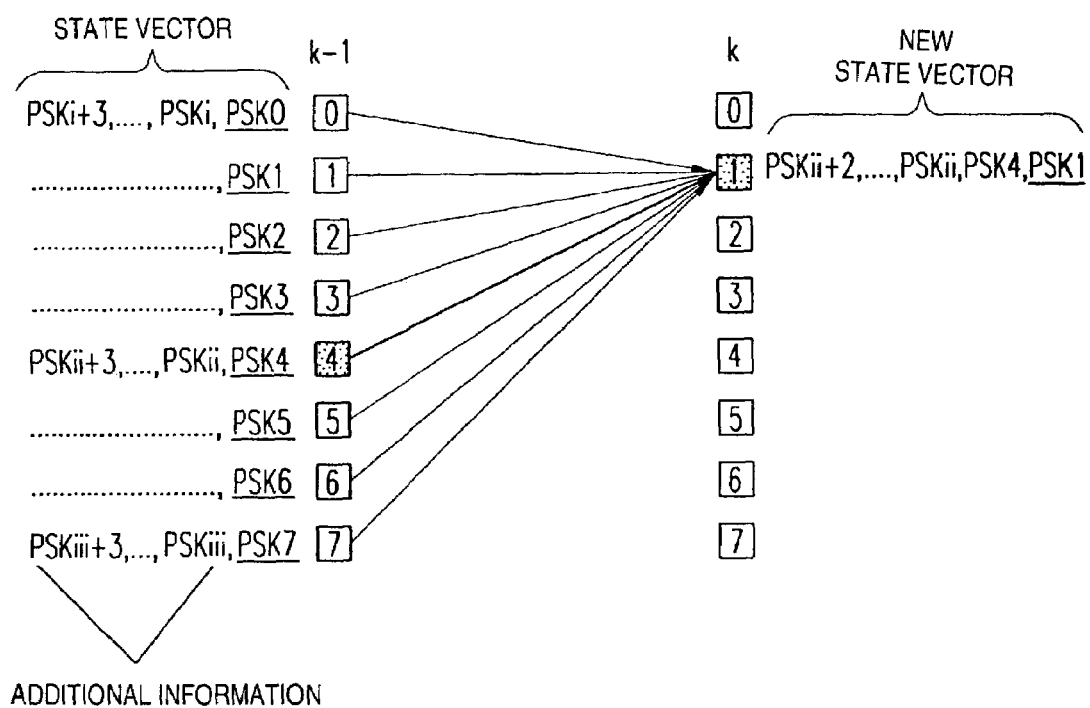
FIG. 3 is a schematic illustration of a state transition between the time steps k−1 and k in order to explain how an ACS operation is carried out and how state vectors are produced.

FIG. 3 shows the eight states relating to the time step k−1 and the eight states relating to the time step k by means of boxes numbered successively from 0 to 7. These state numbers are also referred to as indices for the states in the following text. Furthermore, the state vectors of the states are quoted with respect to the time step k−1. For example, the state with the index 4 (which corresponds to PSK4) in the time step k−1 was reached via the predecessor states PSKii, PSKii+1, PSKii+2, and PSKii+3, that is to say the state vector for this state is as follows:

PSKii+3,PSKii+2,PSKii+1,PSKii,PSK4

FIG. 3 shows the transitions from all the states relating to the time step k−1 to a specific state relating to the time step k, namely the state with the index 1. The additional information relating to the specific state with the index 1 relating to the time step k is dependent on the respectively considered transition, since this defines the additional information for this state. For the transition, which is indicated by a thick arrow, from the state with the index 4 relating to the time step k−1 to the state with the index 1 relating to the time step k, the additional information is: PSKii+2,PSKii+1,PSKII, PSK4.

The metric increment for the state transition being considered is calculated, using equation (2), to be $$I = (x_{k-1} - \sum_{j=0,1,2,3} PSKii + j \cdot H_{j+2} - PSK4 \cdot H_1 - \underline{PSK1} \cdot H_0)^2 \quad (4)$$

The metric increments relating to the transitions from the other possible predecessor states relating to the time step k−1 to the specific state with the index 1 relating to the time step k are calculated in an analogous manner.

Figure 2:
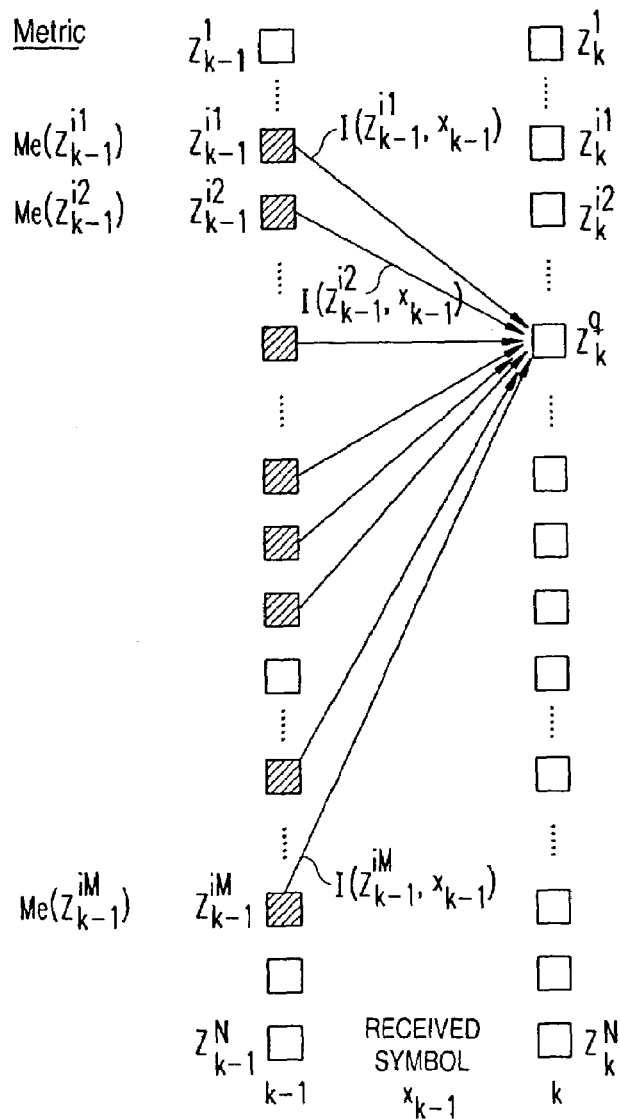
FIG. 2 is a schematic illustration of a detail from a trellis diagram for M=8 relating to the time steps k−1 and k.

In a corresponding way to the explanatory notes relating to FIG. 2, the calculated metric increments are then added, in the addition step of the ACS operation, to the already calculated metrics for the predecessor states (relating to the time step k−1). That new metric which has the smallest value is found in the comparison step. In the situation being considered, this should be the metric value which results for the transition, shown in bold, from the state with the index 4 relating to the time step k−1 to the state 1 under consideration, relating to the time step k. The selection of this "correct" predecessor state with the state vector PSKii+3, ..., PSKii,PSK4 allows the new state vector for the state with the index 1 relating to the time step k to be formed, and this is as follows:

PSKii+2,PSKii+1,PSKii,PSK4,PSK1

Once the ACS operations relating to all the states in the time step k have been carried out, all the state vectors for these states have been determined.

In the illustrated example, transitions are possible between all the states. This is a necessary result of the fact that, with an 8-step data signal, eight transitions lead to each destination state, and in the simplified channel model being considered here, only eight channel states are considered, that is to say a reduced trellis by N=M is considered for this example.

Figure 4A:
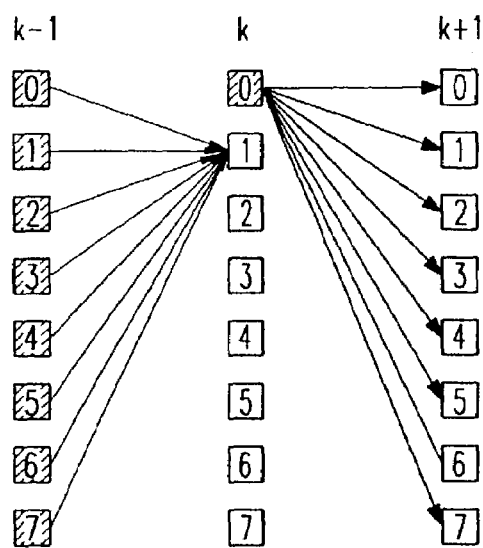
FIG. 4A is a schematic illustration of state transitions from the time steps k−1 to k and from k to k+1 in order to explain how the possible state metrics are calculated in an ACS operation and how the metric increments are calculated.
Figure 4B:
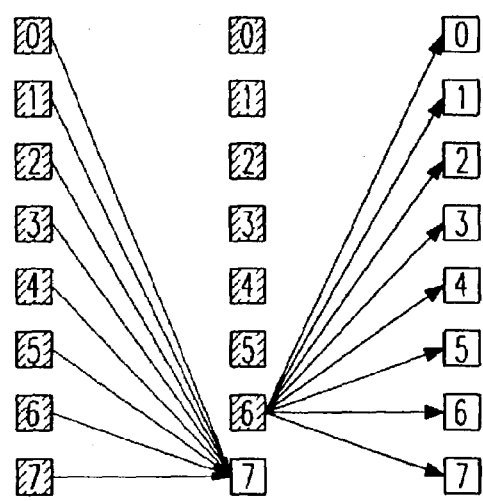
FIG. 4B is a schematic illustration of state transitions from the time steps k−1 to k and from k to k+1 in order to explain how the possible state metrics are calculated in an ACS operation and how the metric increments are calculated at a later time.
Figure 4C:
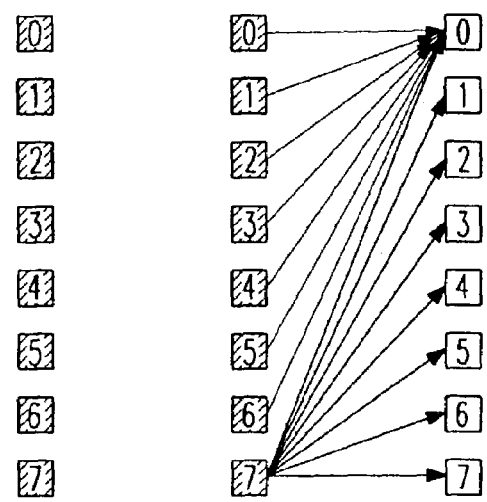
FIG. 4C is a schematic illustration of the state transitions from the time steps k−1 to k and from k to k+1 in order to explain how the possible state metrics are calculated in an ACS operation and how the metric increments are calculated at an even later time.

FIGS. 4A, 4B and 4C explain the timing of the Viterbi equalization process according to the invention with respect to three subsequent points in time. Each figure of the illustration shows the channel states, which are annotated with their indices, relating to the time steps k−1, k and k+1.

The left-hand part of FIG. 4A corresponds to FIG. 3, that is to say the possible metrics for the state with the index 1 relating to the time step k have just been calculated (in the course of the addition step in the ACS operation). The ACS operations are carried out (in each case linked to a destination state in the time step k) in the time sequence of rising index numbers, that is to say the ACS operation relating to the state with the index 0 (with respect to the time step k) has already been carried out, while ACS operations relating to the states with the indices 2, 3, ..., 7 (relating to the time step k) have not yet been carried out. In consequence, the state vector for the state with the index 0 (relating to the time step k) is already known, while the state vectors for the remaining states (relating to the time step k) are not yet known.

The state vectors for all the states relating to the time step k−1 are, of course, already known, while the state vectors for all the states relating to the time step k+1 are still unknown. The states with known state vectors are represented shaded in FIG. 4A to FIG. 4C.

According to the invention, once an ACS operation has been carried out relating to a destination state in the time step k, the eight metric increments of the eight transitions to the states relating to the time step k+1 are then determined, starting from this destination state (whose state vector is now known). In the stage of the calculation sequence illustrated in FIG. 4A, these calculations have been carried out for the transitions starting from the state with the index 0 relating to the time step k to the states relating to the time step k+1. The transitions for which metric increments are calculated are represented by black bold arrows. The calculated metric increments are calculated in an equivalent way to "a stock pile", and are initially stored for subsequent use. The essential feature is that the calculation of the metric increments is always carried out from a fixed initial state under consideration (in this case, the state with the index 0 relating to the time step k) to the eight destination states relating to the time step k+1, that is to say in the "forwards direction" in time (and hence in the opposite direction to the ACS operation, which is linked to a fixed destination state and considers transitions from possible predecessor states to this destination state). The advantage which results from this calculation mode is based essentially on the fact that the state information of the initial state included in the calculation of the metric increments is the same for all the transitions when calculating the metric increments in the forward direction while, if the metric increments were calculated in the "backward direction" (that is to say linked to a fixed destination state), other initial states relating to the point in time k, and hence different state information, would always have to be taken into account. This would be the situation if all the transition metrics from all the states in the time step k−1 to a fixed destination state in the time step k had to be carried out in parallel.

The calculation of the metric increments from an initial state relating to the time step k to the destination states relating to the time step k+1 can be started immediately after determining the state vector for the initial state under consideration by means of the appropriate ACS operation from the time step k−1 to the time step k. FIGS. 4A to 4C illustrate how these two calculation procedures are matched in time, or are synchronized. In the calculation stage illustrated in FIG. 4B, all the ACS operations relating to the states with the indices 0 to 6 relating to the time step k have already been carried out, and the corresponding state vectors have already been determined. The addition step in the corresponding ACS operation has just been carried out with respect to the state with the index 7 relating to the time step k. At the same time, the metric increments of all the transitions to the states relating to the time step k+1 are calculated with respect to the state with the index 6 relating to the time step k. The metric increments relating to the initial states with the indices 0 to 5 with respect to the time step k have already been determined and stored in this stage of the calculation.

In the illustration in FIG. 4C, the ACS operation for the destination state with the index 0 relating to the time step k+1 can now be started, while the metric increments from the initial state with the index 7 relating to the time step k to the destination states relating to the time step k+1 are still being calculated.

Figure 5:
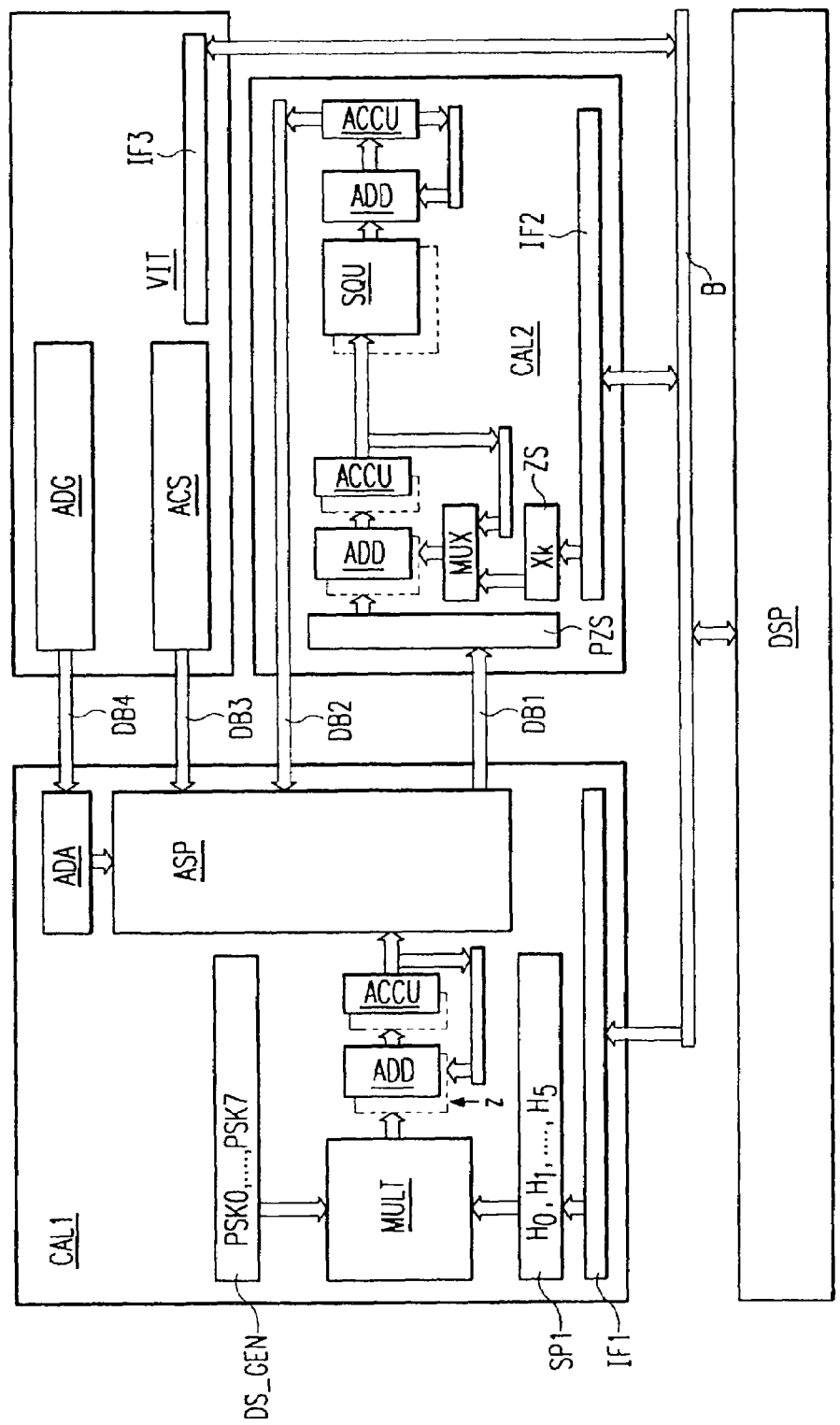
FIG. 5 is a block diagram of an exemplary implementation of a Viterbi equalizer according to the invention.

FIG. 5 shows a block diagram for a Viterbi equalizer according to the invention. In the illustrated example, the Viterbi equalizer comprises four data processing units, namely a digital signal processor DSP, a first calculation unit CAL1 for calculating partial sums of metric increments, a second calculation unit CAL2 for addition of suitable partial sums for the calculation of the metric increments, and a Viterbi unit VIT.

A bidirectional data link is formed from the DSP via a bus system B to the first calculation unit CAL1, to the second calculation unit CAL2, and to the Viterbi unit VIT.

The first calculation unit CAL1 comprises an interface IF1, a memory SP1 for storing the estimated channel impulse responses $H_0$, $H_1$, . . . , $H_5$, a multiplier MULT, a data symbol generator DS_GEN for producing the 8-PSK data symbols, an addition stage comprising an adder ADD and a downstream accumulator ACCU, and an output memory ASP, which is equipped with an address drive ADA.

Partial sums of metric increments are calculated in the first calculation unit CAL1, and are stored in the output memory ASP.

For this purpose, the first calculation unit CAL1 is first of all supplied with the estimated channel input responses $H_0$, $H_1$, . . . , $H_5$ calculated by the DSP, via the bus system B, and these are stored in the memory SP1.

As soon as the transfer of the channel impulse responses $H_0$, $H_1$, . . . , $H_5$ from the DSP to the first calculation unit CAL1 has been completed, CAL1 starts to calculate the partial sums $PSKi1 \cdot H_{j+1} + PSKi0 \cdot H_j$. The partial sums are each based, for example, on two estimated channel impulse responses $H_{j+1}$, $H_j$ and on two 8-PSK data symbols PSKi1 and PSKi0. Two fixed channel impulse responses (for example j=0, that is to say the two fixed channel impulse responses are $H_0$ and $H_1$) are used for calculating a first set of partial sums. Each 8-PSK data symbol PSKi1, PSKi0 may assume eight different values. The first set of partial sums thus comprises 64 different partial sums.

A second set of partial sums (for example for the two estimated channel impulse responses where j=2) and a third set of partial sums (for example for the two estimated channel impulse responses where j=4) are calculated in an analogous manner. Each partial sum set comprises 64 partial sums.

The calculation of the partial sums as described above is carried out by the multiplier MULT, which, in each multiplication process, multiplies the estimated channel impulse response $H_0$, $H_1$, . . . , $H_5$ by an 8-PSK data symbol PSK0, . . . , PSK7. The addition of the product values produced in this process is carried out in the addition stage ADD, ACCU. In the process of calculating the partial sums as described above, in each case comprising two product values supplied from the multiplier, the addition stage is set to zero via a reset input Z whenever each second product value is received.

In general, the partial amounts calculated by CAL1 relating to metric increments may also be formed from only one product of a channel impulse response and a PSK data symbol or, for example, also from partial sums comprising three such products. In the last-mentioned case, the addition stage ADD, ACCU is reset after receiving every third product value which is emitted from the multiplier MULT. Two sets, each comprising 512 partial sums, are then calculated, with each individual partial sum being formed from three product values. Owing to the greater computation complexity, this variant generally appears to be less advantageous, however, than the calculation of three partial sum sets each comprising two product values per partial sum. The rest of the description of the exemplary embodiment is thus based on the calculation of partial sums comprising two product values.

It is obvious that the number of sets of partial sums to be calculated (subject to the precondition that partial sums of a fixed length are considered) depends on the channel memory length v. If eight estimated channel impulse responses (v=7) are considered, for example, four sets of partial sums, each comprising two product values, would have to be calculated. The rest of the description, which is based on the example of v=5, can be generalized in an obvious manner to consideration of shorter or longer channel memories.

As is indicated by the dashed-dotted lines, the addition stage ADD, ACCU is duplicated in order to make it possible to add the real part and the imaginary part of the product values that are obtained, in parallel. One simple embodiment of the addition stage can likewise be implemented by means of a multiplexed drive.

Figures 6, 7:
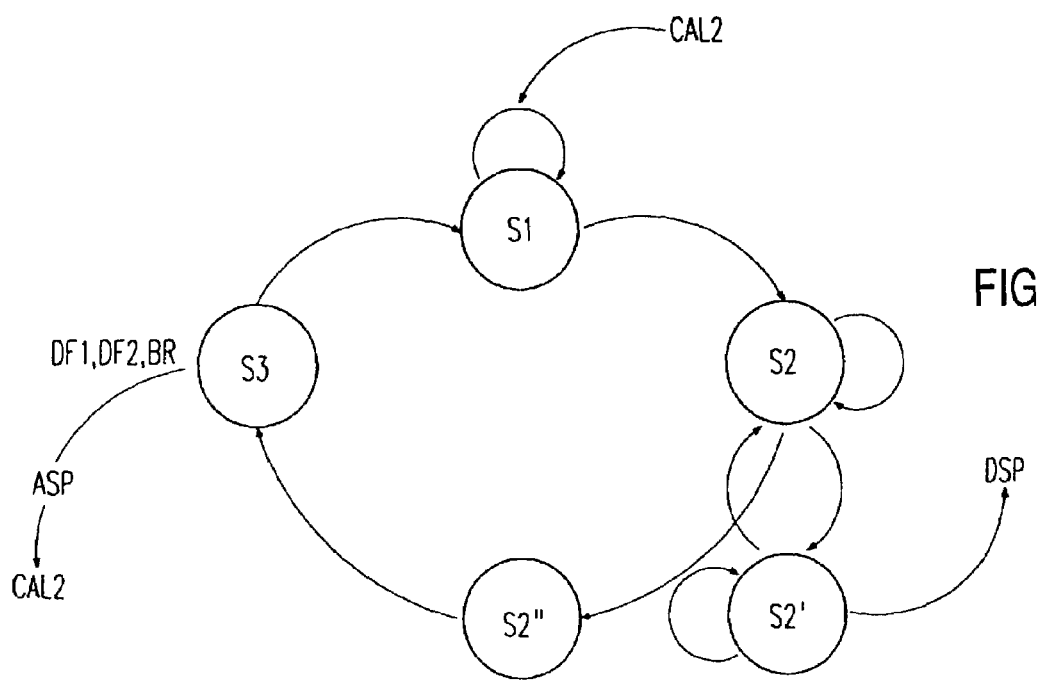
FIG. 6 is a schematic illustration of the partitioning of an output memory for the first calculation unit.
FIG. 7 is a diagram to explain the timing of the calculations and the synchronization of an ACS unit having a DSP and a second calculation unit.

The process of storing the calculated partial sum sets in the output memory ASP will be explained with reference to FIG. 6. The output memory ASP has two memory sections ASP_A3 and ASP_A6 for the calculated partial sum sets. While partial sum sets which are used at present are stored, for example, in the memory section ASP_A6, the partial sum sets which are recalculated for updating the channel impulse responses $H_0$, $H_1$, . . . , $H_5$ are loaded in the memory section ASP_A3. The partitioning of the memory sections ASP_A6 and ASP_A3 takes account of the fact that the partial sums (PaS) are complex values, that is to say the fact that a real part (Re, memory bits 0 to 15) and an imaginary part (Im, memory bits 16 to 31) must be taken into account for each partial sum. Three subsections of the memory sections ASP_A3 and ASP_A6 are available for storage of the three sets.

The first calculation unit does not need to be in the form of hardware, and the corresponding calculation steps can also be carried out by the DSP.

The second calculation unit CAL2 for calculating the metric increments receives, via a data bus DB1, the partial sums relating to the current channel impulse responses either from ASP_A3 or from ASP_A6 of the output memory ASP of the first calculation unit CAL1, and supplies the latter, via a data bus DB2, with the metric increments, calculated on the basis of the partial sums that are obtained, for the transition from, the time step k to the time step k+1, see FIGS. 4A to 4C. These 64 metric increments are stored in a memory section ASP_A4 of the output memory ASP. A memory section ASP_A5 of the memory ASP comprises the 64 metric increments which are calculated for the preceding transitions from the time step k−1 to the time step k.

In order to calculate the metric increments under consideration for the transition from the time step k to the time step k+1, the second calculation unit CAL2 requires firstly the sample value $x_k$ at that time and secondly the "correct" partial sums in order to produce these metric increments.

The sample value $x_k$ at that time is signalled to the second calculation unit CAL2 from the DSP via the bus system B and an internal interface IF2, and is stored in a sample value buffer store ZS.

The correct partial sums (the addressing of the output memory ASP in order to output these correct partial sums will be explained later) are located in a partial sum buffer store PZS in the second calculation unit CAL2.

An addition stage comprising an adder ADD and an accumulator ACCU in each case adds, in accordance with equation (4), three buffer-stored partial sums and, in a fourth addition step, uses a multiplexer MUX to access the buffer-stored sample value $x_k$. The sum value, which is indicated in the bracketed expression in equation (4), is produced at the output of the addition stage (which, owing to the addition of complex-value variables may once again be designed in duplicated or single form, or may be multiplexed).

This sum value is squared by a squarer SQU in the second calculation unit CAL2. The squarer SQU may be in duplicated or single form, or may be time-division multiplexed, in order to square the real part and the imaginary part of the complex sum value. A downstream adder/accumulator adds the squares of the real and imaginary parts.

The squared real sum value is one of the 64 metric increments to be calculated for the transition from the time step k to the time step k+1, which, as already described, is then stored in the memory section ASP_A4 of the output memory ASP.

Building on the state vectors from the time step k as previously determined in the ACS step, this procedure is repeated until all 64 metric increments have been calculated for the transitions under consideration from the time step k to the time step k+1 in the forward direction, see FIGS. 4A–4C.

The interaction between the Viterbi unit VIT and the first and second calculation units CAL1, CAL2 as well as the DSP will be described in the following text. Essentially, the Viterbi unit VIT has three functions. It carries out the ACS operations in order to determine the shortest path to the destination states (within the time step k), it determines the state vectors of the destination states (with respect to the time step k), and it produces the addresses for calling up the correct partial sums from the output memory ASP for the second calculation unit CAL2.

The process for carrying out the ACS operations and for determining the state vectors has already been described with reference to FIGS. 2 to 4C. The production of the addresses for calling up the partial sums will now be explained:

The Viterbi equalizer illustrated in FIG. 5 is assumed to be in the calculation stage, as illustrated in FIG. 4A. This means that the state with the index 0 relating to the time step k has just been determined, and the first 8 metric increments now need to be calculated by the second calculation unit CAL2, starting from this state, to the states relating to the time step k+1.

The state with the index 0 relating to the time step k which has just been determined is assumed to have (any desired) state vector PSKf,PSKe,PSKd,PSKc,PSKb. This state vector is known to the Viterbi unit VIT, since it has just been determined from the latter. The metric increments to be calculated from this initial state to the eight destination states relating to the time step k+1 differ only in their final summand, namely, $PSKa \cdot H_0$. This last summand can assume the following values: $PSK0 \cdot H_0$, $PSK1 \cdot H_0$, $PSK2 \cdot H_0$, $PSK3 \cdot H_0$, $PSK4 \cdot H_0$, $PSK5 \cdot H_0$, $PSK6 \cdot H_0$, $PSK7 \cdot H_0$.

This means that the two partial sums $PSKf \cdot H_5 + PSKe \cdot H_4$ and $PSKd \cdot H_3 + PSKc \cdot H_2$ occur in each metric increment to be calculated. An address generator ADG in the Viterbi unit VIT produces an address DF2 in order to call up the first partial sum $PSKf \cdot H_5 + PSKe \cdot H_4$, and it produces an address DF1 in order to call up the second partial sum $PSKd \cdot H_3 + PSKc \cdot H_2$. Furthermore, the address generator ADG produces eight further addresses BR for calling up the respective partial sums in the last summand of the metric increments to be calculated. The addresses are signalled to the address drive ADA of the output memory ASP via an address data bus DB4. In consequence, ten partial sum memory calls are required in order to calculate the eight metric increments shown in FIG. 4A. The calculation of all 64 metric increments which need to be stored in the memory section ASP_A4 thus requires 80 partial sum memory calls.

After calculating these 64 metric increments, the ACS operations are carried out for the destination states relating to the time step k+1, and the associated state vectors are determined in the process. In order to remain with the illustration selected in FIGS. 4A to 4C, the ACS operations which lead to destination states relating to the time step k are considered instead of this.

In order to carry out these ACS operations, the add-compare-select unit ACS accesses the memory section ASP_A5 and a memory area ASP_A2 of the output memory ASP. The metrics calculated in the previous time step for the states relating to the time step k−1 are stored in the memory section ASP_A2. For each ACS operation (for a specific destination state relating to the time step k), the associated eight metric increments and the associated eight metrics of the predecessor states are read, and are added, compared and selected in the manner already described in order to determine the destination state. Sixteen memory accesses are therefore required per ACS operation in order to determine the eight destination states relating to the time step k. 8 (ACS operations)×16 (memory accesses)=128 memory accesses are therefore required in order to determine all the destination states relating to the time step k.

The metrics of the destination states as calculated in the course of the ACS operations are passed via a data bus DB3 to a memory area ASP_A1 in the output memory ASP, where they are stored.

It is clear from the description above that, according to the invention, 80 partial sum accesses by CAL2 and 64 metric increment accesses as well as 64 metric accesses by the ACS unit ACS must be carried out for the entire calculation procedure for determining the eight states relating to one time step. This results in a total of 208 memory accesses to the output memory ASP.

Based on the conventional procedure, the transition metrics with respect to the point in time (or time step) would be calculated which the ACS unit needs to calculate the metrics. The 8 states, 8 transitions for each state and 3 memory accesses for addressing the partial sums would necessitate 192 memory accesses (in comparison to 80 memory accesses with the procedure according to the invention).

If the metric increments are not calculated and stored in parallel with the ACS calculation, the equalization process would be slowed down by a factor of 192/80=2.4, which is not acceptable in practice owing to the system-dependent requirements.

Storage and reading of the metric increments increases the number of memory accesses based on the conventional procedure from 192 to 192+64+64=320. With 64 metric accesses, the total of 320 memory accesses required based on the conventional procedure compares with a total of 208 required on the basis of the procedure according to the invention.

The difference in the access rates when only partial amounts are calculated comprising a product term (in the form $PSKij \cdot Hj$) in order to reduce the load on the first calculation unit CAL1 is quite obvious.

The 8-PSK data symbols which are determined by the Viterbi unit VIT on the basis of the determined shortest paths are signalled in the form of soft output values via an interface IF3 to the DSP. Three continuous-value estimated values are produced for each estimated 8-PSK data symbol, for three bits of a binary representation of the estimated data symbol.

The synchronization of the Viterbi unit VIT with the second calculation unit CAL2 and with the DSP will be explained with reference to FIG. 7.

In a stage S1 of the calculation sequence, the Viterbi unit VIT waits for the end of a previous calculation of all eight metric increments for the transitions from a specific initial state with the index i−1 relating to the time step k. If these metric increments are calculated and are stored in the memory section ASP_A4 an ACS operation relating to the next (destination) state with the index i+1 relating to the time step k is carried out in the stage S2 of the calculation sequence. In parallel with this, the metric increments for the transitions from the state with the index i to the time step k are calculated in the second calculation unit CAL2. In the course of the ACS operation, the three soft output values for one PSK data symbol are calculated in a calculation loop S2', and are supplied to the DSP after processing of one time unit. In parallel with this, the new state vector relating to the destination state under consideration is calculated in a calculation procedure S2".

In the stage S3 of the calculation sequence, the addresses DF2, DF1 and the 8 addresses BR for calling up the partial sums for the transitions from the state i+1 in the time step k are produced on the basis of the new destination state. In this stage of the sequence, the Viterbi unit VIT is synchronized to the second calculation unit CAL2, which receives the addressed partial sums. The Viterbi unit VIT waits in the stage S1 until the second calculation unit CAL2 has calculated (in the manner already described) the eight metric increments from the specific initial state with the index i relating to the time step k. Once the eight metric increments have been calculated, the waiting state of the Viterbi unit VIT is cancelled (stage S1), which once again means synchronization between CAL2 and the VIT. CAL2 then calculates the transition metrics from the state i+1 for the time step k, while the VIT calculates the metric and the state vector for the state i+2 for the time step k.

The explained configuration results in the second calculation unit CAL2 having to be synchronized to the Viterbi unit VIT, but not the first calculation unit CAL1. However, it is feasible without any problems for the two calculation units CAL1 and CAL2 to be combined to form a unit. Furthermore, the output memory ASP need not be a component of the first calculation unit CAL1, but may be positioned at some other point in the block diagram in FIG. 5. Furthermore, the individual memory sections or subsections of the output memory ASP may also, by way of example, be in the form of separate memory elements.

We claim:

1. A Viterbi equalizer for equalization of a data signal transmitted via a channel that is subject to interference, comprising:
    at least one add-compare-select unit operable to carry out, with reference to each channel state relating to a time step k, an add-compare-select operation for determining a given state transition leading, with minimal metrics, from one possible predecessor state relating to a time step k−1 to a destination state relating to the time step k;
    a calculation unit for calculating metric increments in advance and an output memory for storing the metric increments calculated by said calculation unit;
    said calculation unit being operable to:
        calculate the metric increments for all transitions starting from a given state relating to the time step k to the states in a time step k+1 that can in each case be achieved by the transitions; and
        store the metric increments in said output memory for call-up by said add-compare-select unit for carrying out the add-compare-select operations with respect to the destination states in the time step k+1.

2. The Viterbi equalizer according to claim 1, wherein said calculation unit is configured to calculate in advance the respective metric increments for all states relating to the time step k.

3. The Viterbi equalizer according to claim 1, wherein said calculation unit comprises:
    a first calculation unit for calculating partial amounts of metric increments; and
    a second calculation unit for adding in each case the partial amounts forming the metric increments to be calculated in advance.

4. The Viterbi equalizer according to claim 3, wherein the partial amounts are partial sums.

5. The Viterbi equalizer according to claim 3, wherein said first calculation unit is configured to include into the calculation of the partial amounts a number of channel impulse responses selected from the group consisting of one, two, and three channel impulse responses.

6. The Viterbi equalizer according to claim 3, wherein a metric increment is formed by a sum of a plurality of partial amounts selected from the group consisting of six, three, and two partial amounts.

7. The Viterbi equalizer according to claim 3, wherein said output memory includes a partial amount memory section for storing the partial amounts calculated by said first calculation unit.

8. The Viterbi equalizer according to claim 7, wherein said partial amount memory section is configured to store two complete sets of partial amounts associated with transitions between different time steps.

9. The Viterbi equalizer according to claim 1, wherein the data signal is an 8-step signal.

10. The Viterbi equalizer according to claim 1, wherein the data signal is an 8-PSK signal.

11. A Viterbi equalizer for equalizing a data signal, comprising:
    an input for receiving a data signal sample value for a current time step k;
    a calculation unit connected to said input and configured to calculate metric increments for a plurality of state transitions starting from a given channel state relating to the time step k to channel states in a following time step k+1 to be reached by the state transitions;
    an output memory connected to receive the metric increments from said calculation unit and for storing the metric increments; and
    an add-compare-select unit connected to said output memory and operable to carry out, with reference to each channel state relating to the time step k, an add-compare-select operation for determining a given state transition leading, with minimal metrics, from one possible predecessor state relating to a predecessor time step to a destination time step.

12. A method for equalizing a data signal transmitted via a channel that is subject to interference, wherein the data signal is equalized with the Viterbi algorithm, and the method comprises the following steps:
    calculating, for all transitions between a given state of a time step k and states of a time step k+1 that can be reached from the given state, associated metric increments, and storing the metric increments in an output memory;
    calling up the metric increments from the output memory; and
    determining, with an add-compare-select operation utilizing the metric increments called up from the output memory, a transition leading with minimum metrics from one possible predecessor state relating to the time step k to a specific destination state relating to the time step k+1.

13. The method according to claim 12, which comprises, as soon as an ACS operation relating to a specific destination state relating to a $k^{th}$ time step has been carried out, calculating, taking account of the transition having been found to the state, all the metric increments starting from the specific state to all the states relating to a $k+1^{th}$ time step, even during ongoing add-compare-select operations relating to further states relating to the time step k.

14. The method according to claim 13, which comprises completing the calculation of all the metric increments starting from a specific state relating to the time step k to all the states relating to the $k+1^{th}$ time step prior to starting an add-compare-select operation for a subsequent destination state relating to the time step k.

15. The method according to claim 12, which comprises:
first calculating and storing partial amounts of the metric increments; and
calling up the partial amounts in order to calculate the metric increments associated with the transitions from the given state relating to the time step k to the states that can be reached from the state relating to the time step k+1.

16. The method according to claim 15, wherein the partial amounts are partial sums of the metric increments.

* * * * *